United States Patent [19]

Crivello

[11] Patent Number: 4,610,952
[45] Date of Patent: Sep. 9, 1986

[54] PHOTORESIST COMPOSITIONS AND METHOD

[75] Inventor: James V. Crivello, Clifton Park, N.Y.

[73] Assignee: General Electric Company, Schenectady, N.Y.

[21] Appl. No.: 725,614

[22] Filed: Apr. 22, 1985

Related U.S. Application Data

[62] Division of Ser. No. 531,977, Sep. 14, 1983, Pat. No. 4,537,854.

[51] Int. Cl.$^4$ .......................... G03C 5/16; G03C 1/74
[52] U.S. Cl. .................................... 430/325; 430/911; 430/283; 430/909; 430/916; 430/921; 430/925; 430/330; 430/327; 430/331
[58] Field of Search ............... 430/911, 283, 909, 914, 430/916, 921, 925, 325, 330, 327, 331; 204/159.15, 159.18, 159.24

[56] References Cited

U.S. PATENT DOCUMENTS 2,927,023  8/1956  Martin .............................. 430/911 X

OTHER PUBLICATIONS

Photoinitiated Cationic Polymerization with Triarylsulfonium Salts, Crivello et al., Journal of Polymer Science: Polymer Chemistry Edition, vol. 17, pp. 977-999 (1979).

Triarylsulfonium Salts as Photoinitiators of Free Radical and Cationic Polymerization, Crivello et al, Journal of Polymer Science: Polymer Letters Edition, vol. 17, pp. 759-764 (1979).

Synthesis and Properties of Photopolymer Printing Plates for a Printing Master Plate by Modification of Polyvinyl Alcohol, Nakane et al., American Chemical Society, 1980, ACS Symposium Series 121, pp. 264-279.

Diaryliodonium Salts, A New Class of Photoinitiators for Cationic Polymerization, Crivello et al, Macromolecules, vol. 10, pp. 1307-1315 (1977).

Primary Examiner—John E. Kittle
Assistant Examiner—Cynthia Hamilton
Attorney, Agent, or Firm—William A. Teoli; James C. Davis, Jr.; James Magee, Jr.

[57] ABSTRACT

Water soluble blends are provided of alkanolacrylamide, water soluble hydroxyl containing film forming organic oligomer and an effective amount of an onium salt photoinitiator. These photocurable compositions can be used as photoresists.

1 Claim, No Drawings

PHOTORESIST COMPOSITIONS AND METHOD

This application is a division of application Ser. No. 531,977 now U.S. Pat. No. 4,537,854, filed Sept. 14, 1983.

BACKGROUND OF THE INVENTION

The present invention relates to water soluble photoresist compositions which are based on a simultaneous cationic and free radical cure of a blend of an alkanolacrylamide and a water soluble hydroxyl containing film forming organic oligomer in combination with an onium salt, such as a triarylsulfonium salt, or a diaryliodonium salt.

Prior to the present invention, as shown by Barton, U.S. Pat. No. 4,090,936, photohardenable liquid compositions were provided which were useful as photoresists and consisted of epoxy resin in combination with a polyvinylformal or polyvinylbutyral resin and an effective amount of photoinitiator, such as an aromatic sulfonium salt or aromatic iodonium salt. The photocurable compositions of Barton are based solely on a cationic cure and utilize an organic solvent to develop the unexposed areas of the photoresist employed in the form of a dry film. In U.S. Pat. No. 4,245,029, Crivello, assigned to the same assignee as the present invention, photocurable compositions are shown useful as metal coatings having improved solvent resistance based on the simultaneous free-radical cure and cationic cure of an organic resin mixture. These photocurable compositions utilize a triarylsulfonium salt as a photoinitiator for oxirane containing monomeric or polymeric organic material in combination with an aliphatically unsaturated organic material free of oxirane oxygen. The resulting cured compositions have been found to possess improved solvent resistance as metal coatings.

The present invention is based on the discovery that water soluble blends of alkanolacrylamide, water soluble hydroxyl containing film forming organic oligomer, for example, certain polyvinylalcohols and an effective amount of an onium salt photoinitiator, such as a diaryliodonium salt, or triarylsulfonium salt can be converted to a photocurable film useful as a photoresist. A simultaneous free radical and cationic cure of the exposed portions of the dry film can be readily achieved. The resulting patterned dry film photoresist can then be readily developed in hot water resulting in a finely patterned negative image of the mask.

STATEMENT OF THE INVENTION

There is provided by the present invention a photocurable composition comprising a blend of by weight,
(A) 50 to 98% of a solvent and
(B) 2 to 50% of a photoresist composition comprising
  (i) 100 parts of a water soluble hydroxyl containing film forming organic oligomer,
  (ii) 50 to 100 parts of an alkanolacrylamide, and
  (iii) an effective amount of an onium salt selected from the class consisting of

   (1)

   (2)

where Ar is selected from $C_{(6-13)}$ monovalent hydrocarbon radicals and substituted monovalent hydrocarbon radical, M is a metalloid selected from phosphorous, arsenic and antimony and d is an integer equal to 4-6 inclusive.

Radicals included by Ar of formulas (1) and (2) are, for example, $C_{(6-13)}$ aromatic hydrocarbon radicals, such as phenyl, tolyl, naphthyl, xylyl, anthryl, etc. Radicals included by M of formula (1) are metal or metalloids, such as transition metal, for example, Sb, Fe, Sn, Bi, Al, Ga, In, Ti, Zr, Sc, V, Cr, Mn, Cs, rare earth elements such as the lanthanides, for example, Ce, Pr, Nd, etc., actinides, such as Th, Pa, U, Np, etc., and metalloids such as B, P, As, etc.

Diaryliodonium salts included within formula (1) are, for example,

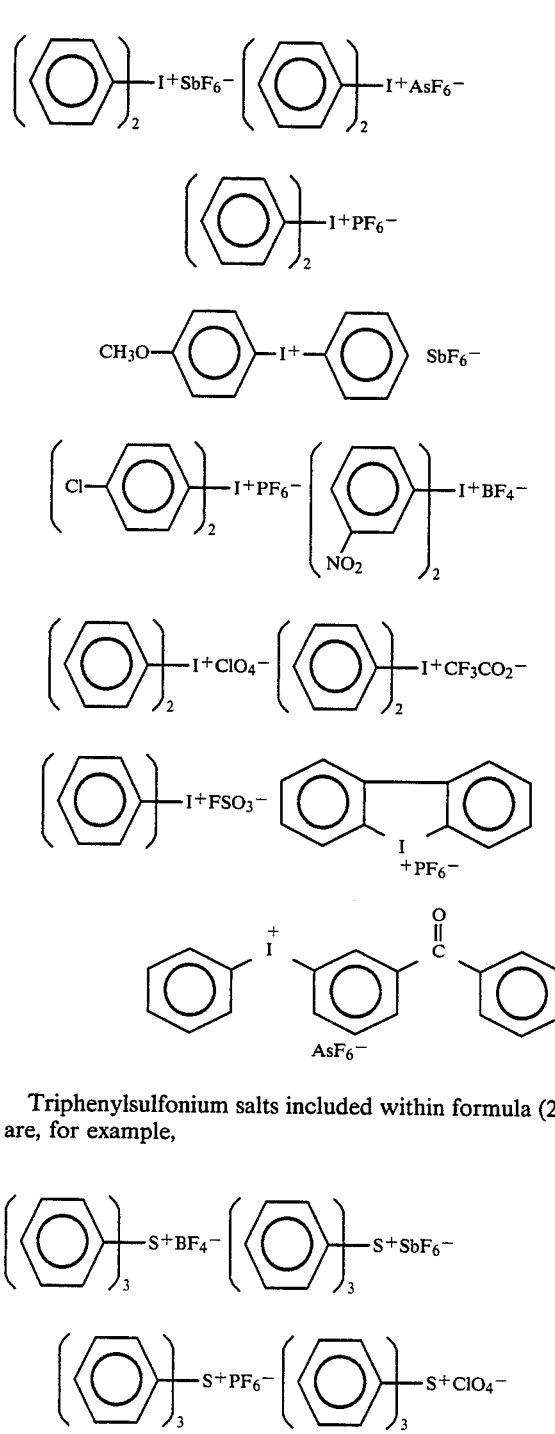

Triphenylsulfonium salts included within formula (2) are, for example,

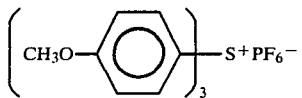

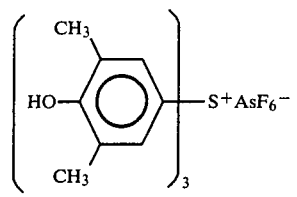

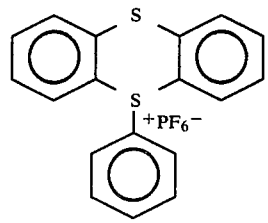

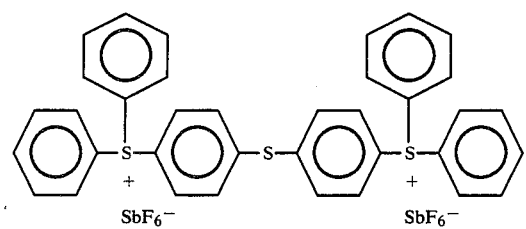

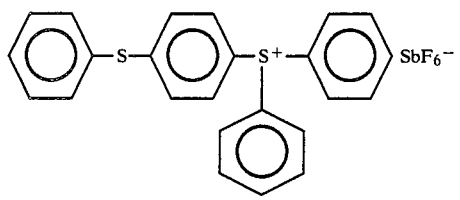

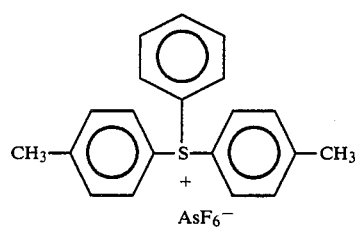

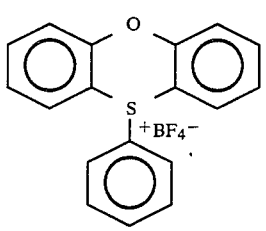

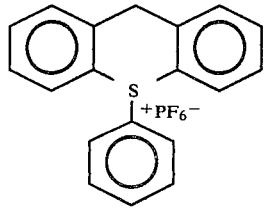

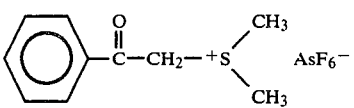

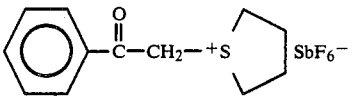

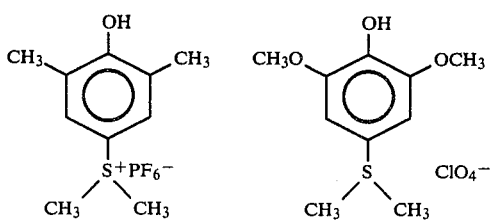

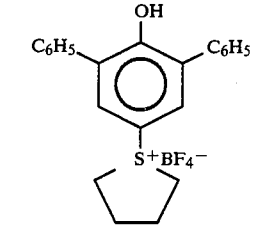

Some of the water soluble hydroxy functional film forming organic oligomers which can be used in making the photocurable compositions of the present invention, are for example, polyvinylalcohol, cellulose, hydroxypropylcellulose, hydroxyethylcellulose, polyvinylbutyral, polyvinylformal, poly-4-hydroxystyrene, poly-2-hydroxyethylacrylate, poly-2-hydroxypropylacrylate, hexamethylolmelamine, 2,3,6-trimethylolphenol and other resols, hydroxyethyl starch, carboxymethyl hydroxyethylcellulose, etc.

Additional examples of water soluble hydroxy functional film forming organic oligomers which can be used in the practice of the present invention are shown under the heading of Polyvinyl Alcohol, in the Encyclopedia of Polymer Science and Technology, Vol. 14, pages 149–207 (1971), Interscience Publishers, John Wiley and Sons, New York. The degree of polymerization of useful polyvinylalcohol is preferably about 500 to 600. Additional materials are water soluble cellulose ether polymers shown in the Kirk Othmer Encyclopedia of Chemical Technology, Vol. 5, 3rd Edition, pages 143–161 (1979), also Interscience Publishers as previously shown. Further materials are shown in Encyclopedia of Polymer Science, Vol. 11, page 396–424, for Polysaccharides (1969) and Gelatin, Vol. 7, 1967, pages 446–460.

There are included within the alkanolacrylamides useful in making the photocurable compositions of the present invention, materials such as, N-methylolacrylamide, N-methylolmethacrylamide, N,N'-(hydroxymethyl)diacrylamide, etc.

In preparing the photoresist compositions of the present invention the order of addition of the various ingredients, such as the water soluble hydroxyl containing film forming organic oligomer, referred to hereinafter as the "water soluble oligomer" alkanolacrylamide and photoinitiator, is not critical. It has been found that solutions of the various components in various solvents, such as water, a $C_{(1-8)}$ alkanol, for example, ethanol, can be used for the curable ingredients, while propylene carbonate can be used as a solvent for the onium salts. The onium salt can be utilized at from 0.1% to about 15% by weight of the photoresist composition, and preferably, 1-3% by weight.

In addition to the onium salts of formulas (1) and (2) there can be employed additional photosensitizers, such as benzophenone, thioxanthone, Michler's ketone, perylene and acridine orange. Additional radical photoinitiators can be combined with the aforementioned onium salts in order to increase their photoresponse, such as benzoin, benzoin alkyl ethers, acetophenone, 2,2-dimethoxyacetal, benzyl, dimethylketal, and 2-chloroacetophenone. In addition, additives such as trimethylolisocyanurate, dimethylolurea, and dimethylolthiourea can also be added to the composition to increase crosslink density and improve the physical properties of the cured photoresist. In addition to being employed as photoresist, the curable compositions of the present invention can be used to make photographic printing plates, name plates, metalographic etch resists, and conformal coatings.

Cure of the photocurable compositions of the present invention can be achieved by use of radiant energy, such as electron beam, or ultraviolet light. Electron beam cure can be effected at an accelerator voltage of from about 100 to 1,000 Kv. Cure of the compositions is preferably achieved by the use of UV irradiation having a wave-length of from 1849 A to 4000 A and an intensity of at least 5,000-80,000 microwatts per $cm^2$. The lamp system used to generate such radiation can consist of ultraviolet lamps such as from 1 to 50 discharge lamps, for example, xenon, metallic halide, metallic arc, such as a low, medium or high pressure mercury vapor discharge lamp, etc., having an operating pressure of from a few millimeters to about 10 atmospheres, etc., can be employed. The lamps can include envelopes capable of transmitting light of a wavelength of from about 1849 A to 4000 A, and preferably 2400 A to 4000 A. The lamp envelope can consist of quartz, such as spectrocil, or Pyrex, etc. Typical lamps which can be employed for providing ultraviolet radiation are, for example, medium pressure mercury arcs, such as the GE H3T7 arc and the Hanovia 450 W arc lamp. The cures may be carried out with a combination of various lamps, some of or all of which can operate in an inert atmosphere. When using UV lamps, the irradiation flux on the substrate can be at least 0.01 watts per square inch to effect cure of the organic resin within 1 to 20 seconds and permit the cure to be carried on continuously.

In order that those skilled in the art will be better able to practice the invention, the following examples are given by way of illustration and not by way of limitation. All parts are by weight.

EXAMPLE 1

There was added 10 grams of a 6% aqueous solution of N-methylolacrylamide and 1.4 grams of a 50% solution of triphenylsulfonium hexafluoroantimonate in propylene carbonate to a solution of 15 grams of polyvinyl alcohol, Elvanol 51-05 of the E.I. Du Pont de Nemours Company, of Wilmington, Del. dissolved in 50 ml of ethanol and 20 ml of water. The resulting clear solution was coated onto a 2"×3" glass plate. The coated glass plate was then placed in a 100° C. oven until a dry film was formed. There was then placed a contact mask over the surface of the film and the film was irradiated. The film was irradiated for 1 minute at a distance of 4 inches.

After irradiation, the film was heated to 100° C. for about 1 minute. The film was then washed with hot water at 50° C. There was obtained a finely patterned negative image. A microscopic examination of the negative mass image showed that it had nearly vertical profile with sharp edges.

Similar results were obtained utilizing diphenyliodonium hexafluoroarsenate as the photoinitiator for the same photoresist composition in place of the triphenylsulfonium hexafluoroantimonate.

EXAMPLE 2

There was added 1.4 grams of triphenylsulfonium hexafluoroantimonate as a 50% solution in propylene carbonate to a solution of 15 grams of a medium viscosity hydroxyethyl cellulose resin obtained from the Polysciences Company of Warrington, PA, and 20 grams of a 6% aqueous solution of N-methylolacrylamide in 40 ml of ethanol and 16 ml of water.

The above photoresist solution was coated onto a glass substrate and dried for 5 minutes in a 100° C. forced air oven. The resulting film was then covered with a mask and irradiated as described in Example 1 and the photopatterned film was developed with cold water. There was obtained a sharply defined negative image of the mask.

EXAMPLE 3

There was added 10 grams of a 60% aqueous solution of N-methylolacrylamide, 20 ml of ethanol and 0.4 gram of

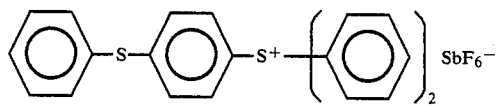

dissolved in 1 gram of propylene carbonate to 10 grams of polyvinyl alcohol (Elvanol 51-05). The mixture was stirred until homogeneous and then spread as a 2 mil film onto glass plates. The films were then dried at 100° C. for 5 minutes. The films were then irradiated and developed in accordance with the procedure of Example 1. After 3 minutes immersion in hot water, the glass plates were dried revealing an excellent negative image of the mask.

EXAMPLE 4

The procedure of Example 1 was repeated, except that there was added 0.5 grams of n-butylbenzoin ether to the original aqueous photoresist formulation. The dry films were prepared on glass substrates which were irradiated for 1 minute followed by heating at 100° C. for 2 minutes. The films were then developed at 50°–60° C. water. The resolution of the resulting negative images were found to be considerably better than 0.05 mm.

Although the above examples are directed to only a few of the very many variables which can be utilized in making the photoresist compositions of the present invention, it should be understood that the photoresist compositions of the present invention include a much broader variety of ingredients as set forth in the description preceding these examples.

What I claim as new and desire to secure by Letters Patent of the United States is:

1. A method of patterning a photoresist on a substrate which comprises
    (1) applying photocurable composition on a substrate which photocurable composition comprises
        (A) 50 to 98% of a solvent, and
        (B) 2 to 50% of a photoresist composition comprising
            (i) 100 parts of a water soluble hydroxyl functional film forming organic oligomer,
            (ii) 50 to 100 parts of an alkanolacrylamide, and
            (iii) an amount of an onium salt which is sufficient to effect the cure of the photoresist elected from the class consisting of $[Ar_3I]^+[MF]_d^-$, and $[Ar_3S]^+[MF]_d^-$, (2) heating the treated substrate to a temperature in the range of from 50° C. to 150° C. to produce a dry film on the treated substrate,
    (3) contacting the treated substrate with a mask and irradiating the substrate, and
    (4) developing the treated substrate in water to produce a patterned photoresist on the surface of the substrate, where Ar is selected from $C_{(6-13)}$ aromatic hydrocarbon radical and substituted aromatic hydrocarbon radical, M is a metalloid selected from phosphorous, arsenic and antimony and d is an integer equal to 4–6 inclusive.

* * * * *

UNITED STATES PATENT AND TRADEMARK OFFICE
CERTIFICATE OF CORRECTION

PATENT NO. : 4,610,952
DATED : September 9, 1986
INVENTOR(S) : James V. Crivello It is certified that error appears in the above-identified patent and that said Letters Patent is hereby corrected as shown below:

Column 7, line 19, after "applying" insert -- a --

" 7, " 20, after "comprises" insert -- by weight --

" 8, " 7, delete " $[Ar_3I]$ " and substitute therefor -- $[Ar_2I]$ --

Signed and Sealed this

Twenty-seventh Day of January, 1987

Attest:

DONALD J. QUIGG

Attesting Officer       Commissioner of Patents and Trademarks